(12) United States Patent
Belady et al.

(10) Patent No.: US 9,655,285 B2
(45) Date of Patent: May 16, 2017

(54) POWER SUPPLY SYSTEM AND METHOD OF MANAGING THE SAME

(71) Applicant: Elwha LLC, Bellevue, WA (US)

(72) Inventors: Christian L. Belady, Mercer Island, WA (US); Douglas M. Carmean, Seattle, WA (US); William Gates, Medina, WA (US); Shaun L. Harris, College Station, TX (US); Roderick A. Hyde, Redmond, WA (US); Muriel Y. Ishikawa, Livermore, CA (US); Sean M. James, Olympia, WA (US); Brian A. Janous, Issaquah, WA (US); Jordin T. Kare, Seattle, WA (US); Jie Liu, Medina, WA (US); Max N. Mankin, Cambridge, MA (US); Gregory J. McKnight, Bellevue, WA (US); Craig J. Mundie, Seattle, WA (US); Nathan P. Myhrvold, Medina, WA (US); Tony S. Pan, Bellevue, WA (US); Clarence T. Tegreene, Mercer Island, WA (US); Yaroslav A. Urzhumov, Bellevue, WA (US); Charles Whitmer, North Bend, WA (US); Lowell L. Wood, Jr., Bellevue, WA (US); Victoria Y. H. Wood, Livermore, CA (US)

(73) Assignee: Elwha LLC, Bellevue, WA (US)

( * ) Notice: Subject to any disclaimer, the term of this patent is extended or adjusted under 35 U.S.C. 154(b) by 242 days.

(21) Appl. No.: 14/555,799

(22) Filed: Nov. 28, 2014

(65) Prior Publication Data

US 2016/0157388 A1 Jun. 2, 2016

(51) Int. Cl.
 *H05K 7/20* (2006.01)
 *G06F 1/26* (2006.01)
 *H01M 8/18* (2006.01)
 *H01M 8/20* (2006.01)

(52) U.S. Cl.
 CPC .......... *H05K 7/20763* (2013.01); *G06F 1/26* (2013.01); *H05K 7/20836* (2013.01); *H01M 8/18* (2013.01); *H01M 8/20* (2013.01)

(58) Field of Classification Search
 None
 See application file for complete search history.

(56) References Cited

U.S. PATENT DOCUMENTS

| | | | |
|---|---|---|---|
| 6,468,688 B2 | 10/2002 | Kazacos et al. | |
| 7,078,123 B2 | 7/2006 | Kazacos et al. | |
| 7,820,321 B2 | 10/2010 | Horne et al. | |
| 8,785,023 B2 | 7/2014 | Horne et al. | |
| 2001/0028977 A1 | 10/2001 | Kazacos et al. | |

(Continued)

*Primary Examiner* — Scott J Chmielecki
(74) *Attorney, Agent, or Firm* — Foley & Lardner LLP

(57) ABSTRACT

A power supply system for a data center includes a cooling circuit, an electrochemical power generator, a sensor, and a processor. The cooling circuit includes a fluid configured to receive heat energy generated by a server located in the data center. The electrochemical power generator is configured to receive and/or generate the fluid of the cooling circuit and to generate electrical energy for the server using the fluid. The sensor is configured to obtain data regarding the server. The processor is configured to control an amount of heat energy transferred from the server to the fluid based on the data.

35 Claims, 5 Drawing Sheets

(56) References Cited

U.S. PATENT DOCUMENTS

| | | |
|---|---|---|
| 2003/0143456 A1 | 7/2003 | Kazacos et al. |
| 2009/0284911 A1* | 11/2009 | Morehead .................. G06F 1/20 361/679.47 |
| 2010/0003545 A1 | 1/2010 | Horne et al. |
| 2011/0045332 A1 | 2/2011 | Horne et al. |
| 2011/0117411 A1 | 5/2011 | Horne et al. |
| 2011/0223450 A1 | 9/2011 | Horne et al. |
| 2012/0077095 A1 | 3/2012 | Roumi et al. |
| 2012/0326672 A1 | 12/2012 | Dennis et al. |
| 2013/0011702 A1 | 1/2013 | Horne et al. |
| 2013/0011704 A1 | 1/2013 | Horne et al. |
| 2013/0071714 A1 | 3/2013 | Perry et al. |
| 2013/0189592 A1 | 7/2013 | Roumi et al. |
| 2013/0302710 A1 | 11/2013 | Boersma et al. |
| 2014/0050999 A1 | 2/2014 | Tolmachev |
| 2014/0162095 A1 | 6/2014 | Coad |
| 2014/0170511 A1 | 6/2014 | Tolmachev |
| 2014/0199564 A1 | 7/2014 | Tang et al. |

* cited by examiner

POWER SUPPLY SYSTEM AND METHOD OF MANAGING THE SAME

BACKGROUND

Electrochemical power generators, such as fuel cells and flow batteries (e.g., vanadium redox flow batteries, etc.), can be used to generate electrical energy to power various devices and systems. For example, in some applications, electrochemical power generators can be used to generate electrical energy to power data servers in a data center. Data servers generate large amounts of heat and typically require an auxiliary cooling system, such as fans, heat exchangers, or other similar cooling devices to maintain a normal operating temperature. Generally speaking, auxiliary cooling systems use a working fluid (e.g., water, coolant, etc.) that is separate and distinct from the fluid(s) used in the electrochemical power generators (e.g., reactants, fuels, oxidants, etc.).

SUMMARY

One embodiment relates to a power supply system for a data center including a cooling circuit, an electrochemical power generator, a sensor, and a processor. The cooling circuit includes a fluid and is configured to receive at least a portion of heat energy generated by a server located in the data center. The electrochemical power generator is configured to receive and/or generate the fluid of the cooling circuit and to generate electrical energy for the server using the fluid. The sensor is configured to obtain data regarding the server. The processor is configured to control an amount of heat energy transferred from the server to the fluid based on the data.

Another embodiment relates to a power supply system for a data center including a cooling circuit and an electrochemical power generator. The cooling circuit is configured to exchange heat energy between a server located in the data center and a fluid being circulated in the cooling circuit such that at least a portion of the heat energy released by the server is absorbed by the fluid. The electrochemical power generator is configured to receive the fluid from the cooling circuit and to generate power for the server using the fluid.

Yet another embodiment relates to a power supply system for a data center including an electrochemical power generator and a cooling circuit. The electrochemical power generator is configured to generate a fluid by-product and to generate electrical energy for the server. The cooling circuit is configured to receive the fluid by-product from the electrochemical power generator, to circulate the fluid by-product within the cooling circuit, and to exchange heat energy between a server located in the data center and the fluid by-product such that at least a portion of the heat energy released by the server is absorbed by the fluid by-product.

Yet another embodiment relates to a control system for a data center including a cooling circuit, an electrochemical power generator, and a processor. The cooling circuit includes a fluid and is configured to receive at least a portion of heat energy generated by a server located in the data center. The electrochemical power generator is configured to receive and/or generate the fluid of the cooling circuit and to generate power for the server. The processor is configured to: receive power demand data regarding a power demand of the server; control an amount of power generated by the electrochemical power generator based on the power demand data; and control an amount of heat energy transferred to the fluid from the server based on the power demand data.

Yet another embodiment relates to a method of managing a power supply system for a data center. The method includes circulating a fluid in a cooling circuit; obtaining data regarding a server located in the data center using a sensor; controlling the transfer of heat energy from the server to the fluid based on the data; coupling the fluid to an electrochemical power generator; and generating power for the server using the fluid in the electrochemical power generator.

Yet another embodiment relates to a method of managing a power supply system for a data center. The method includes circulating a fluid in a cooling circuit; exchanging heat energy between a server located in the data center and the fluid in the cooling circuit; transferring the fluid to an electrochemical power generator; and generating power for the server using the fluid in the electrochemical power generator.

Yet another embodiment relates to a method of managing a power supply system for a data center. The method includes circulating a fluid in a cooling circuit to exchange heat energy between a server located in the data center and the fluid; coupling the fluid to an electrochemical power generator; generating power for the server using the fluid in the electrochemical power generator; receiving data regarding a power demand of the server; controlling an amount of power generated by the electrochemical power generator based on the power demand data; and controlling an amount of heat energy transferred between the server and the fluid based on the power demand data.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
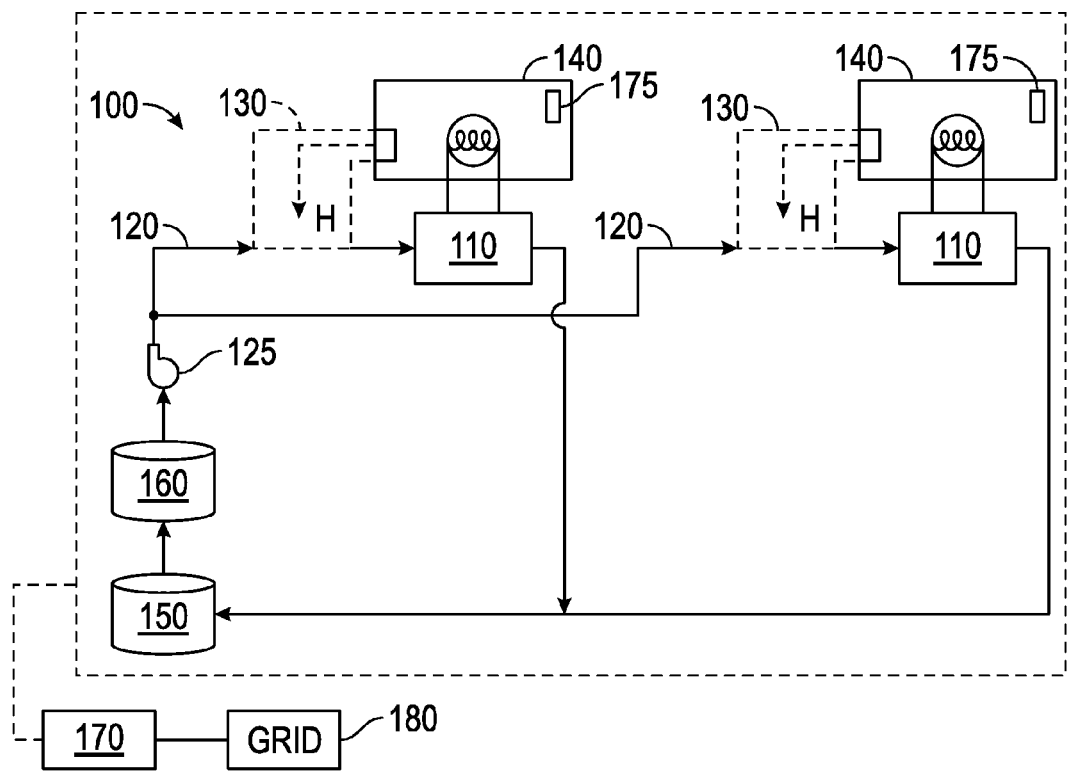
FIG. 1 is a schematic illustration of a power supply system, according to one embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

A problem with traditional electrochemical power generators (e.g., fuel cells, flow batteries, etc.) as a power source for data servers is that they generally use gases (e.g., methane, hydrogen, etc.) and operate at high temperatures. One reason for this is to achieve a large electrochemical potential in the power generator, which can result in an operating condition where water would be electrolyzed if it were present. Therefore, most electrochemical power generators do not use liquid reactants in water-based power solutions.

However, in the context of data servers, the native voltage requirements for the electrical circuits are low (e.g., 0.8 to 1.5 volts). Accordingly, liquid reactants having low electrochemical potentials (i.e., low temperature aqueous reactants) may be used as a working fluid in the electrochemical power generator to provide electrical energy to power the data servers. The liquid reactants can also be used as a heat exchange fluid to absorb heat energy from the data server electronics. In other embodiments, liquid by-products resulting from an electrochemical reaction in the electrochemical power generator can be used as a heat exchange fluid to absorb heat energy from the data server.

Referring generally to the Figures, disclosed herein are power supply systems and methods for managing power supply systems using a working fluid (e.g., a low temperature aqueous reactant) both to absorb heat energy from a load (e.g., a data center, a server, etc.) and to generate electrical energy (i.e., serving as a reactant or a by-product) in an electrochemical power generator (e.g., a fuel cell, a flow battery, etc.) to provide power to a server in a data center. In one embodiment, the amount of heat energy generated by the data server and absorbed by the working fluid is controlled based on data regarding the server (e.g., temperature data, power demand data, power delivery rate data, usage data, etc.). In another embodiment, the amount of power (i.e., electrical energy) generated by the electrochemical power generator is controlled based on data regarding the data server (e.g., power demand data, power delivery rate data, etc.).

In the various embodiments disclosed herein, the power supply system includes a centralized storage tank (i.e., reservoir, vessel, container, etc.) configured to store the working fluid (i.e., reactants or by-products) for use by a plurality of electrochemical power generators located at one or more data servers within the data center. The reactants can be communicated from the storage tank to the local power generators using a pump and a conduit (e.g., small-diameter tubing, piping, etc.). The by-products from the electrochemical reaction in the electrochemical power generator can be delivered to a storage tank, and/or regenerated into reactants using electrical energy from a power source. For example, an external power source (e.g., electricity from an external power grid) can be imported to the data center and be used to regenerate liquid by-products into reactants which can then be stored in a storage tank. At a future time, as a data server requires electrical power, the stored reactants can be delivered to an electrochemical power generator near the server, supplying it with electricity. Reaction by-products from the electrochemical power generator can be transported to a storage tank, either for disposal, or for future regeneration into reactants when external power is available for regeneration.

The above described process allows delivery of external power to be time shifted from the use of the power to run a server; for instance, by allowing electricity to be bought at night (e.g., for a relatively low price because demand is lower than during the day) and used throughout the day. This process also can allow internal transport of power within the data center to be performed indirectly using fluid transport rather than directly using electricity. If power needs to be delivered to the data servers at a low voltage (e.g., a voltage matching the data server circuitry), delivery as electrochemical reactants can be advantageous compared to delivery of low voltage, high current electricity. In this way, the power supply system can operate in a closed loop with the fluid (i.e., liquid reactants, liquid by-products, etc.) operating as both a heat exchange fluid and a fuel for the electrochemical power generator.

Referring to FIG. 1, a schematic illustration of power supply system 100 is shown according to one embodiment. Power supply system 100 is shown operatively coupled to data servers 140, which form part of a data center. In various embodiments, the data center includes a plurality of data servers 140 located therein. In other embodiments, the data center includes only one data server 140. As shown in FIG. 1, power supply system 100 includes electrochemical power generators 110 each operatively coupled (i.e., connected, etc.) to data servers 140 to provide electrical energy for powering each data server 140. In the embodiment shown, electrochemical power generators 110 are local to data servers 140 (i.e., located in close proximity to data centers 140). For example, electrochemical power generators 110 may be located at data servers 140, at a rack for data servers 140, in a structure housing data servers 140, or at the electronic chip level of data servers 140. In various embodiments, electrochemical power generators 110 may be a fuel cell, a flow battery (e.g., a vanadium redox flow battery, an iron-chromium flow battery, a zinc-iron flow battery, a quinine-based organic flow battery, etc.), or other similar type of electrochemical device configured to generate electrical energy using a reactant (e.g., a fuel, an oxidant, etc.) having a low electrochemical potential. In some embodiments, a flow battery may comprise reactants the same as or similar to those discussed in "Reduction Potentials of One-Electron Couples Involving Free Radicals in Aqueous Solutions", authored by Peter Wardman, J. Phys. Chem. Ref. Data, Vol. 18, page 1637 (1989).

Power supply system 100 includes conduit 120 defining a flow path configured to receive/circulate a fluid therein (i.e., a reactant, an aqueous liquid reactant, a fuel, an oxidant, etc.). Conduit 120 is connected at one end to tank 160 (i.e., storage tank, reservoir, vessel, container, etc.). Tank 160 is configured to hold/retain a volume of working fluid (i.e., liquid reactant, fuel, etc.) for use in power supply system 100. As shown in FIG. 1, conduit 120 fluidly couples tank 160 to electrochemical power generator 110. In various embodiments, conduit 120 may be a tube, a pipe, or other similar conduit suitable for communicating fluid in power supply system 100. In various embodiments, the fluid is circulated throughout power supply system 100 using pump 133 or other similar device suitable for transferring fluid.

As shown in FIG. 1, power supply system 100 includes tank 150 disposed along conduit 120. Tank 150 is configured to receive a by-product fluid resulting from an electrochemical reaction in the electrochemical power generators 110. In the embodiment shown, tank 150 is operatively connected to control system 170 and to electrical grid 180. Tank 150, control system 170, and electrical grid 180 collectively define a regeneration system configured to regenerate the by-product fluid received at tank 150 into a liquid reactant for re-use in power supply system 100. For example, tank 150 including a volume of by-product fluid is configured to receive electrical energy from electrical grid 180. The electrical energy can be used in conjunction with control system 170 to regenerate the by-product fluid into a useable liquid reactant (e.g., a fuel, an aqueous liquid reactant, an oxidant, etc.). The regenerated reactant can be transferred from tank 150 to tank 160 for storage and reuse in power supply system 100.

In the embodiment shown in FIG. 1, power supply system 100 further includes cooling circuits 130 disposed between tank 160 and electrochemical power generator 110. As shown, cooling circuits 130 are locally positioned at each data server 140. Cooling circuits 130 are in thermal communication with each data server 140. In this manner, heat energy can be transferred from data servers 140 to fluid being circulated in cooling circuit 130. In one embodiment, cooling circuits 130 are configured to circulate fluid received from tank 160 via conduit 120. The fluid is circulated past data servers 140 to absorb heat energy discharged by data servers 140 when data servers 140 are operating. The heat energy is absorbed by the fluid flowing/circulating in cooling circuits 130. The fluid having the absorbed heat energy is transferred back to conduit 120 for use in electrochemical power generator 110 to generate electrical energy for powering data servers 140. This configuration is advantageous because the heat energy absorbed from data servers 140 not only helps to reduce the operating temperature of data servers 140, but also acts as a pre-heating step for the fluid before being reacted in electrochemical power generators 110. The pre-heating step helps facilitate a chemical reaction in electrochemical power generators 110 to produce electrical energy for data servers 140.

In another, unillustrated, embodiment, one or more fluid by-products being transported from electrochemical power generator 110 (e.g., to storage tank 150) are circulated past data servers 140 to absorb heat energy discharged by data servers 140 when data servers 140 are operating. In some embodiments, one or more reactants and/or by-products are contained and transported within a carrier fluid (e.g., water, etc.). In such embodiments, heat energy discharged by data servers 140 can also be received by the carrier fluid in addition to the reactants or by-products carried within the carrier fluid. In some embodiments, both reactants and by-products are circulated past data servers 140 to absorb heat energy discharged by data servers 140. Since the reactants and by-products are generally at different temperatures, the amount of each fluid circulated past data servers 140 can be controlled so as to vary the fluid temperature to which data servers 140 transfer heat, thereby controlling the amount of heat energy removed from data servers 140.

Power supply system 100 further includes sensors 175 each coupled to data servers 140. In one embodiment, sensors 175 are coupled directly to data servers 140. In other embodiments, sensors 175 may be coupled to a data server rack for holding/retaining data servers 140 or to another portion (or structure) of the data center. Sensors 175 are configured to obtain data regarding data servers 140. In various embodiments, sensors 175 may be a thermistor, an infrared sensor, or other similar type of electronic sensor suitable for obtaining data from data servers 140 or an area surrounding data servers 140.

In one embodiment, sensors 175 are configured to obtain data regarding a temperature of data servers 140. In one embodiment, the temperature data is indicative of an operating temperature of data servers 140. In another embodiment, the temperature data is an ambient temperature surrounding data servers 140 within the data center. In another embodiment, the temperature data is a temperature of heat transfer fluid leaving data servers 140. In another embodiment, the temperature data is a temperature rise (i.e., a temperature change) of heat transfer fluid receiving heat energy from data servers 140. In another embodiment, sensors 175 are configured to obtain data regarding a power demand for data servers 140. In another embodiment, sensors 175 are configured to obtain data regarding a usage level (e.g., computational work load, etc.) for data servers 140. In another embodiment, sensors 175 are configured to obtain data regarding a power delivery rate from electrochemical power generators 110. In other embodiments, sensors 175 are configured to obtain a combination of the above data regarding data servers 140.

Power supply system 100 further includes control system 170 configured to receive the data obtained by sensors 175. Control system 170 is also configured to control an amount of heat energy generated by servers 140 and transferred to the fluid based on the sensor data (e.g., through a processor discussed in greater detail with respect to FIG. 5). For example, in one embodiment, the data obtained by sensors 175 is indicative of an operating temperature of data servers 140. Based on the temperature data, control system 170 and, in particular, a processor (such as central processing unit 171 shown in FIG. 5), is configured to increase an amount of heat energy transferred from data servers 140 to fluid circulating in cooling circuit 130 if the temperature of data servers 140 exceeds a threshold value stored in control system 170 (e.g., a pre-set or programmable value). Alternatively, the processor is configured to decrease an amount of heat energy transferred from data servers 140 to fluid circulating in cooling circuit 130 if the temperature of data servers 140 is below a threshold value (e.g., a threshold temperature value). In this manner, control system 170 is adapted to maintain a target operating temperature of data servers 140, thereby improving operation and performance of data servers 140.

In another embodiment, the data obtained by sensors 175 is a power demand of data servers 140, or a related metric such as a usage level/amount of data servers 140. For example, if control system 170 determines that there is an increase in power demand by servers 140 (e.g., due to an increase in use of data servers 140), control system 170 is configured to increase an amount of heat energy transferred from data servers 140 to fluid circulating in cooling circuit 130. Similarly, if control system 170 determines that there is a decrease in power demand by servers 140, control system 170 is configured to decrease an amount of heat energy transferred from data servers 140 to fluid circulating in cooling circuit 130. In this manner, control system 170 can anticipate and adapt power supply system 100 to changes in the cooling/temperature requirements of data servers 140 based on an amount of power demanded by data servers 140.

In another embodiment, the power demand data obtained from data servers 140 is used to control an amount of power generated by electrochemical power generators 110. For example, if control system 170 determines that there is an increase in power demand by servers 140 (e.g., due to an increase in use of data servers), control system 170 is configured to increase an amount of fluid received by electrochemical power generators 110 to increase an amount of electrical energy generated by electrochemical power generators 110. Similarly, if control system 170 determines that there is a decrease in power demand by servers 140, control system 170 is configured to decrease an amount of fluid received by electrochemical power generators 110 to decrease an amount of electrical energy generated by electrochemical power generators 110.

Figure 2:
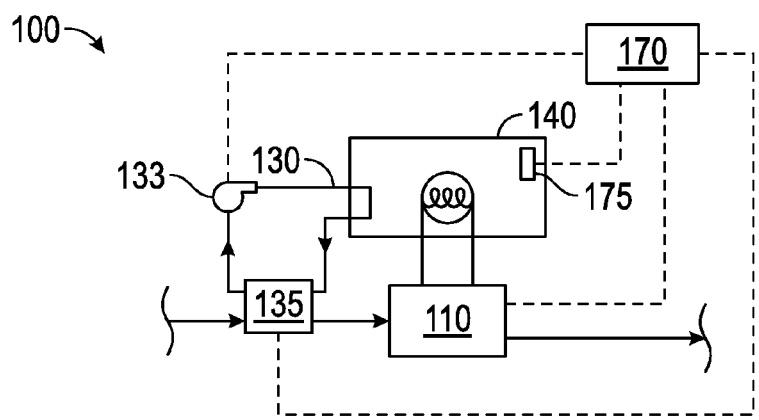
FIGS. 2-4 are schematic illustrations of portions of various power supply systems, according to various embodiments.
Figure 3:
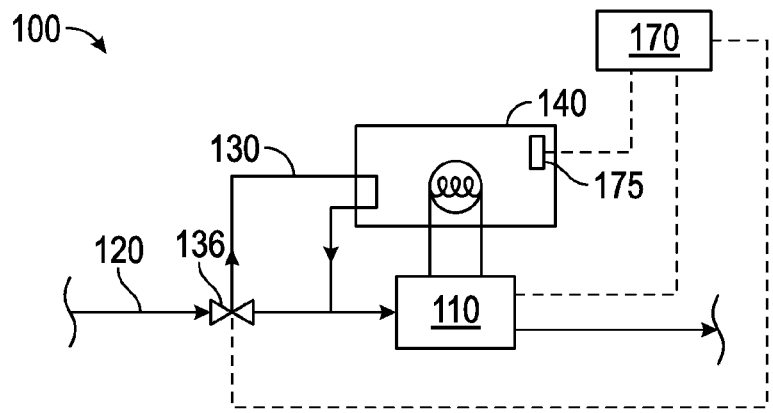
Figure 4:
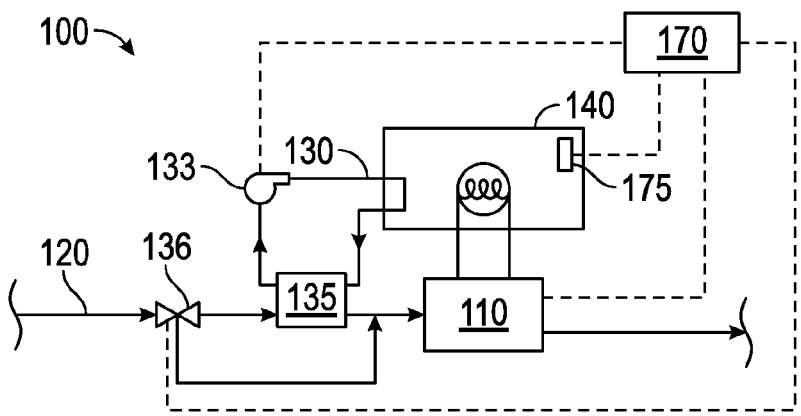

Referring to FIGS. 2-4, various systems for controlling/managing the amount of heat energy transferred from data servers 140 are shown. In the embodiment shown in FIG. 2, power supply system 100 includes heat transfer device 135 disposed along conduit 120. In one embodiment, heat transfer device 135 is a heat exchanger. In various embodiments, heat transfer device 135 may be an air-to-liquid heat exchanger, a liquid-to-liquid heat exchanger, a heat pipe, or other similar type of heat transfer device suitable for exchanging heat energy between data servers 140 and cooling circuit 130. In one embodiment, cooling circuit 130 is configured to circulate a secondary fluid (i.e., a second fluid, an intermediate fluid, etc.) past data servers 140. The secondary fluid is configured to absorb/receive at least a portion of the heat energy generated by data servers 140. Heat transfer device 135 is configured to exchange heat energy between the secondary fluid circulating in cooling circuit 130 and the fluid (i.e., a first fluid) flowing within conduit 120 toward electrochemical power generator 110.

In the embodiment shown in FIG. 2, data regarding data server 140 is obtained by sensor 175 and sent to control system 170. In one embodiment, control system 170 is configured to control the amount of heat energy transferred to the fluid flowing along conduit 120 by adjusting an area of contact between the fluid and the heat exchanger. For example, if control system 170 determines that there is an increase in temperature (or power demand) based on data received from sensors 175, control system 170 can increase the area of contact between the fluid and the heat exchanger (e.g., by sending a control signal to move the heat exchanger toward the fluid circulating along conduit 120). In one embodiment, the control signal can be an alert (e.g., an audible signal, a visual signal, etc.) to a user to manually adjust/move the heat exchanger and/or conduit 120. In another embodiment, power supply system 100 can include a motor configured to receive the control signal and to automatically adjust/move the heat exchanger and/or conduit 120.

In another embodiment shown in FIG. 2, control system 170 can adjust a flow rate of the secondary fluid circulating along cooling circuit 130 based on the data obtained by sensor 175. For example, if control system 170 determines that there is an increase in temperature (or power demand) based on data received from sensors 175, control system 170 can increase the flow rate of the secondary fluid circulating along cooling circuit 130 to increase the amount of heat energy exchanged between data server 140 and the secondary fluid. The flow rate of the secondary fluid can be adjusted by sending a control signal from control system 170 to pump 133 disposed along cooling circuit 130.

In another embodiment shown in FIG. 3, power supply system 100 includes valve 136 disposed between conduit 120 and cooling circuit 130. Valve 136 is configured to control a flow of fluid from conduit 120 to cooling circuit 130. In the embodiment shown, cooling circuit 130 is in contact with data server 140 such that heat energy from data server 140 is absorbed by fluid circulating along cooling circuit 130. In one embodiment, cooling circuit 130 includes a pipe (i.e., a conduit, a tube, etc.) configured to exchange heat energy directly with data server 140 using conduction.

In one embodiment, control system 170 is configured to control operation of valve 136 to control the amount of heat energy transferred from data server 140 based on data obtained by sensor 175. For example, if control system 170 determines that there is an increase in temperature (or power demand) based on data received from sensor 175, control system 170 can open valve 136 to increase the amount of fluid circulating along cooling circuit 130 to thereby increase the amount of heat energy exchanged between data server 140 and the fluid. Alternatively, if control system 170 determines that there is a decrease in temperature (or power demand) based on data received from sensor 175, control system 170 can close valve 136 to divert the fluid circulating along cooling circuit 130 to conduit 120 to thereby decrease the amount of heat energy exchanged between data server 140 and the fluid. The operation of valve 136 is controlled by sending a control signal from control system 170 to valve 136.

Referring to FIG. 2, in another embodiment, heat transfer device 135 is a heat pipe in thermal communication with data server 140. In one embodiment, control system 170 is configured to adjust a thermal conductivity of the heat pipe to thereby control an amount of heat energy exchanged between data server 140 and the fluid circulating along cooling circuit 130. For example, if control system 170 determines that there is an increase in temperature (or power demand) based on data received from sensors 175, control system 170 can increase the thermal conductivity of the heat pipe to increase the amount of heat energy exchanged between data server 140 and the fluid circulating along the heat pipe of cooling circuit 130. In one embodiment, the heat pipe may be a variable conductance heat pipe such that the effective thermal conductivity may be varied as desired (e.g., by varying the amount of a non-condensable buffer gas within the heat pipe).

According to another embodiment shown in FIG. 4, cooling circuit 130 includes heat transfer device 135 and pump 133 disposed along cooling circuit 130. Pump 133 is configured to circulate a secondary fluid (i.e., a second fluid, an intermediate fluid, etc.) along cooling circuit 130. The secondary fluid is configured to absorb/receive at least a portion of the heat energy generated by data server 140 (e.g., via conduction, via heat transfer device, etc.). Heat transfer device 135 is configured to facilitate heat energy exchange between the secondary fluid and the fluid (i.e., a first fluid) circulating along conduit 120.

In the embodiment shown, power supply system 100 also includes valve 136 disposed along conduit 120 upstream from heat transfer device 135. In this embodiment, control system 170 is configured to control operation of valve 136 to thereby control the amount of heat energy transferred between data server 140 and the fluid circulating along conduit 120. For example, if control system 170 determines that there is an increase in temperature (or power demand) based on data received from sensor 175, control system 170 can open valve 136 to increase the amount of fluid circulating along conduit 120 toward heat transfer device 135 to thereby increase the amount of heat energy exchanged between data server 140 and the fluid (e.g., through the secondary fluid). Alternatively, if control system 170 determines that there is a decrease in temperature (or power demand) based on data received from sensor 175, control system 170 can close valve 136 to divert the fluid circulating along conduit 120 to bypass heat transfer device 135 and thereby decrease the amount of heat energy exchanged between data server 140 and the fluid. The operation of valve 136 is controlled by sending a control signal from control system 170 to valve 136.

In the embodiments shown in FIGS. 1-4, control system 170 may be configured to adjust an amount of fluid circulating within conduit 120 and travelling through or past cooling circuit 130 to thereby control the amount of heat energy exchanged between data server 140 and the fluid. For example, if control system 170 determines that there is an increase in temperature (or power demand) based on data received from sensors 175, control system 170 can increase the amount of fluid circulating along conduit 120 past or through cooling circuit 130 to increase the amount of heat energy exchanged between data server 140 and the fluid. The amount of the fluid can be adjusted by sending a control signal from control system 170 to a valve, such as valve 136, disposed along conduit 120.

Figure 5:
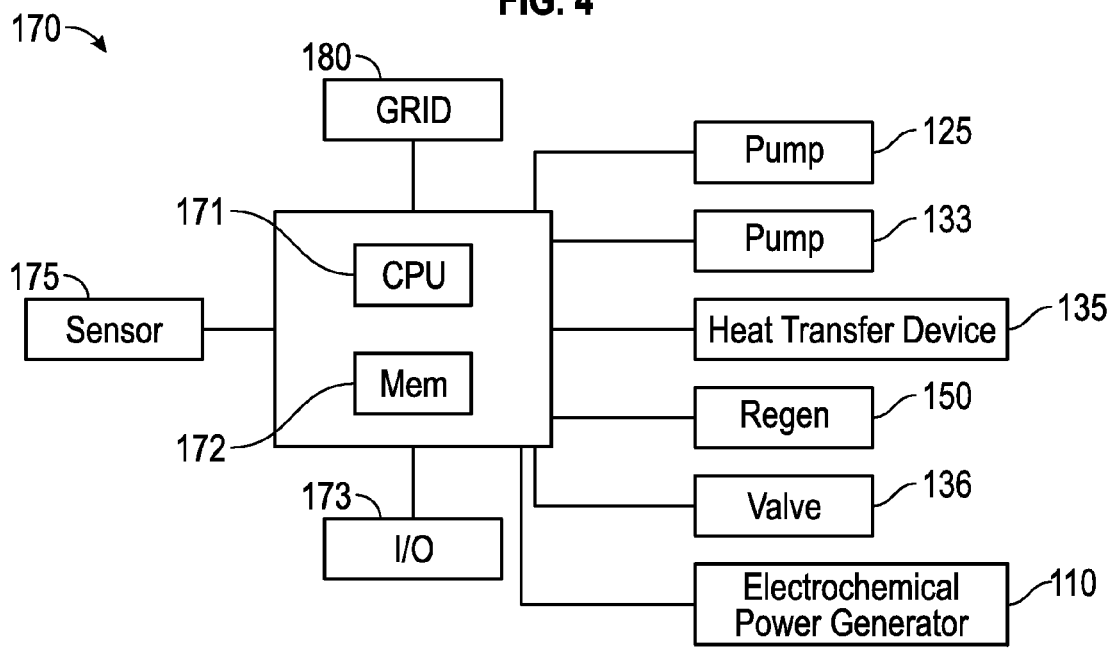
FIG. 5 is a schematic illustration of a control system for a power supply system, according to one embodiment.
Figure 6:
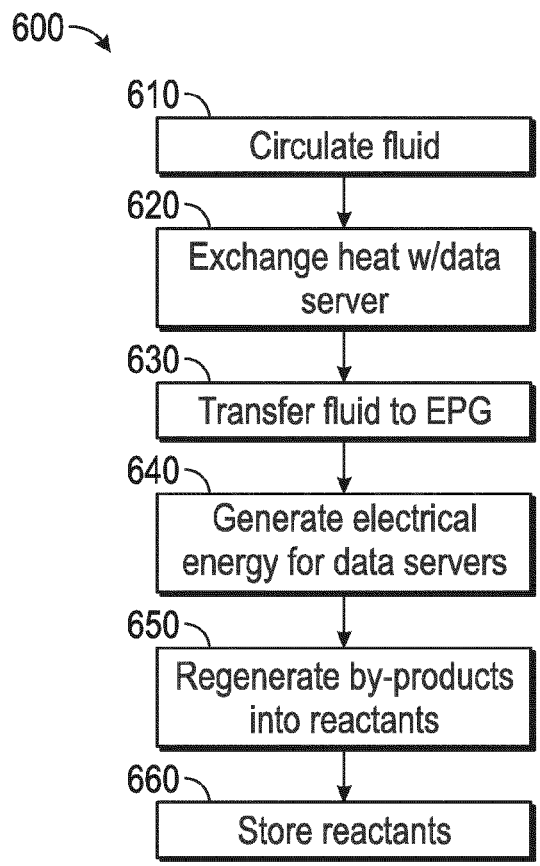
FIG. 6 is a flow diagram of a method for managing a power supply system, according to one embodiment.

Referring to FIG. 5, control system 170 is shown according to one embodiment. Control system 170 includes a processor shown as central processing unit 171. Control system 170 also includes memory 172 configured to store data relating to power supply system 100 (e.g., temperature data, power demand data, power delivery rate data, etc.). As shown in FIG. 5 and as described above, central processing unit 171 is configured to receive data from sensors 175. In one embodiment, central processing unit 171 is configured to control an amount of heat energy transferred from data servers 140 to fluid being circulated in cooling circuit 130 based on the data received from sensors 175. The data obtained by sensors 175 can include a temperature of data servers 140, a temperature or a temperature rise/change of the fluid, a power demand or usage level of data servers 140, and/or a power delivery rate for electrochemical power generators 110. The various data obtained by sensors 175 can be stored in memory 172 for later use and/or analysis.

In another embodiment, central processing unit 171 is configured to control an amount of power generated by electrochemical power generators 110 based on power demand data for data servers 140. Central processing unit 171 can also be configured to control an amount of heat energy transferred to fluid being circulated in or past cooling circuit 130 from data servers 140. As described above, central processing unit 171 is configured to control the amount of heat energy transferred from data servers 140 in various ways. In one embodiment, central processing unit is configured to operate pump 125 (shown in FIG. 1) and/or pump 133 (shown in FIGS. 2 and 4) to control the amount of heat energy transferred from data servers 140 based on data obtained from sensors 175. In another embodiment, central processing unit 171 is configured to operate pump 125 to control the amount of electrical energy generated by electrochemical power generators 110. In another embodiment, central processing unit 171 is configured to adjust a position of heat transfer device 135 to control the amount of heat energy transferred from data servers 140. In another embodiment, central processing unit 171 is configured to control operation of valve 136 to control the amount of heat energy transferred from data servers 140. In this manner, control system 170 can actively control an amount of heat energy transferred from data servers 140 and an amount of power generated by electrochemical power generators 110 based on real-time data obtained by sensors 175.

As shown in FIG. 5, control system 170 also includes a connection to electrical grid 180 to receive electrical power to perform various operations. In one embodiment, central processing unit 171 is configured to receive electrical power from grid 180 and to regenerate electrochemical by-products into liquid reactants at tank 150 (labeled as REGEN in FIG. 5). Control system 170 also includes I/O port 173 for sending and receiving various control signals to and from control system 170 (e.g., electronic signals, audio signals, visual signals, alerts, etc.).

In the various embodiments described herein, central processing unit 171 may be implemented as a general-purpose processor, an application specific integrated circuit (ASIC), one or more field programmable gate arrays (FPGAs), a digital-signal-processor (DSP), a group of processing components, or other suitable electronic processing components. Memory 172 is one or more devices (e.g., RAM, ROM, Flash Memory, hard disk storage, etc.) for storing data and/or computer code for facilitating the various processes described herein. Memory 172 may be or include non-transient volatile memory or non-volatile memory. Memory 172 may include database components, object code components, script components, or any other type of information structure for supporting the various activities and information structures described herein. Memory 172 may be communicably connected to central processing unit 171 and provide computer code or instructions to central processing unit 171 for executing the processes described herein.

Referring to FIGS. 6-9, various methods for controlling/managing power supply system 100 are shown according to various embodiments. According to one embodiment shown in FIG. 6, method 600 includes circulating a fluid in cooling circuit 130 (610). Method 600 further includes exchanging heat energy between data servers 140 and the fluid circulating in cooling circuit 130 (620). The fluid is transferred from cooling circuit 130 to electrochemical power generators 110 (630). The fluid is reacted in electrochemical power generators 110 to generate electrical energy for use by data servers 140 (640). As a result of the electrochemical reaction in electrochemical power generators 110, a by-product fluid is created. The by-product fluid is regenerated into a reactant fluid in tank 150 using electrical energy from grid 180 (650). The regenerated fluid is transferred to tank 160 for storage and reuse in power supply system 100 (660).

Figure 7:
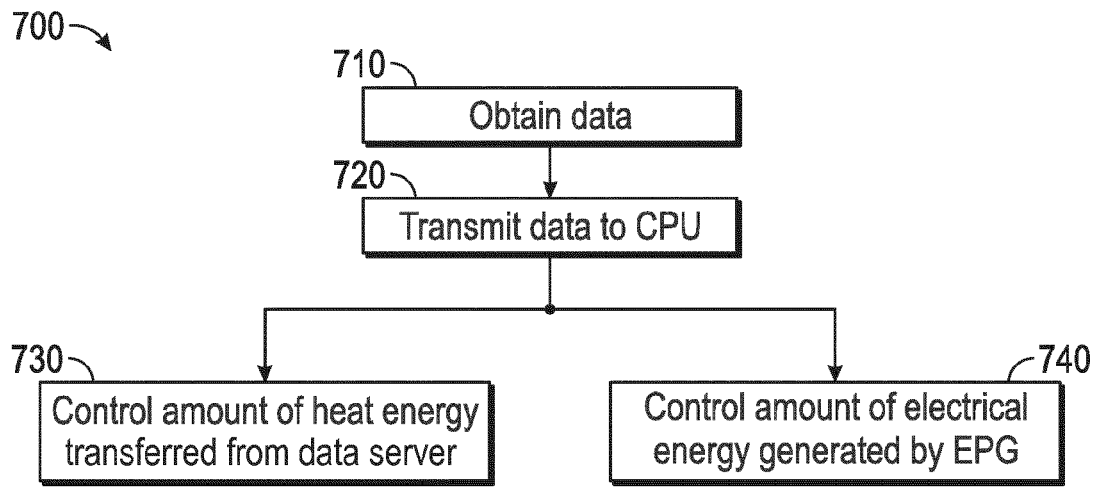
FIGS. 7-15 illustrate various flow diagrams for managing a power supply system, according to various embodiments.

Referring to FIG. 7, method 700 is shown for controlling the amount of heat energy transferred from data servers 140 and for controlling the amount of electrical energy generated by electrochemical power generators 110, according to one embodiment. As shown, sensors 175 obtain data regarding data servers 140 (710). In one embodiment, the data is a temperature of data servers 140. In another embodiment, the data is a power demand of data servers 140. In another embodiment, the data is a power delivery rate of electrochemical power generators 110. Method 700 further includes transmitting the data obtained from sensors 175 to control system 170 and, in particular, to central processing unit (CPU) 171 (720). The data is used by central processing unit 171 both to control the amount of heat energy transferred from data servers 140 (730) and to control the amount of electrical energy generated by electrochemical power generators 110 (740).

Figure 8:
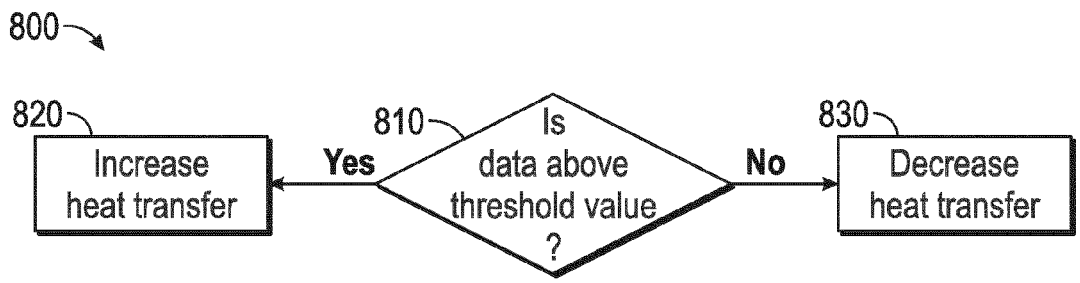

In one embodiment shown in FIG. 8, method 800 includes determining whether a parameter value for data obtained from sensors 175 (i.e., temperature data, power demand data, power delivery rate data) is above or below a threshold value (810). If the parameter value is above the threshold value stored in control system 170 (e.g., a pre-set or programmable value), method 800 includes increasing the amount of heat energy transferred from data servers 140 to the fluid (820). Alternatively, if the parameter value is below the threshold value, method 800 includes decreasing the amount of heat energy transferred from data servers 140 to the fluid (830).

Figure 9:
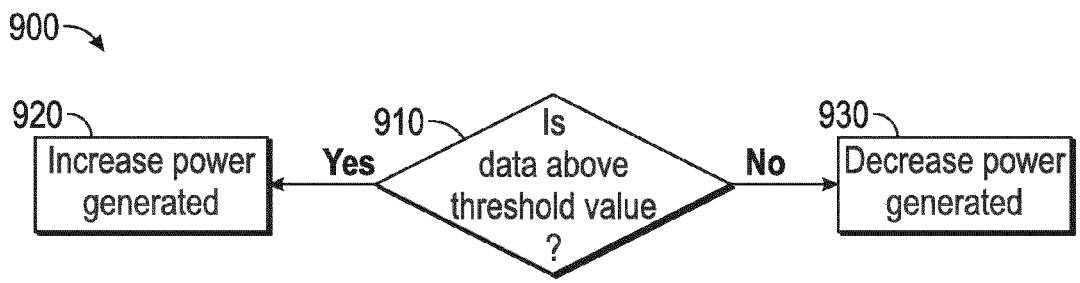

In another embodiment shown in FIG. 9, the data obtained by sensors 175 is used to control the amount of electrical energy (i.e., power) generated by electrochemical power generators 110. As shown in FIG. 9, method 900 includes determining (using central processing unit 171) whether a parameter value obtained by sensors 175 is above or below a threshold value (e.g., a power demand, a power delivery rate) (910). If the parameter value is above a threshold value stored in control system 170 (e.g., a pre-set or programmable value), then method 900 includes sending a control signal for increasing the amount of electrical energy generated by electrochemical power generators 110 (920). Alternatively, if the parameter value is below a threshold value, then method 900 includes sending a control signal for decreasing the amount of electrical energy generated by electrochemical power generators 110 (930).

Figure 10:
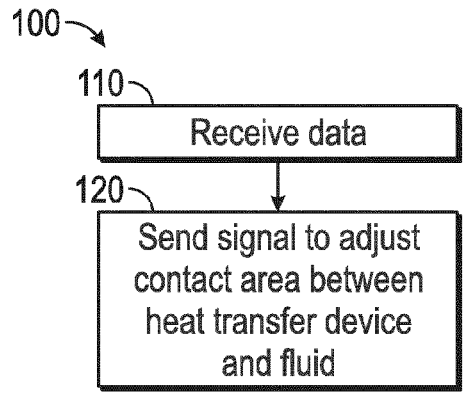

The amount of heat energy transferred from data servers 140 may be controlled in various ways, as described above with reference to FIGS. 1-4. For example, referring to FIG. 10, method 100 is shown in accordance with power supply system 100 of FIG. 2, according to one embodiment. Method 100 includes receiving data from sensors 175 (110). Method 100 further includes sending a control signal for adjusting an area of contact between a fluid flowing along conduit 120 and heat transfer device 135 to control the amount of heat energy transferred from data servers 140 based on the data (120). In one embodiment, heat transfer device 135 is a heat exchanger (e.g., a liquid-to-liquid heat exchanger, an air-to-liquid heat exchanger, etc.). In another embodiment, heat transfer device 135 is a heat pipe (e.g., a variable conductance heat pipe, etc.). In other embodiments, heat transfer device 135 is another type of heat transfer device suitable for receiving heat energy from data servers 140.

Figure 11:
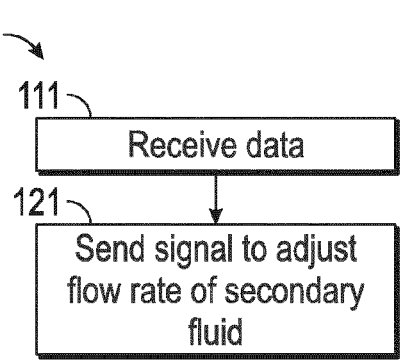

Referring to FIG. 11, method 101 is shown in accordance with power supply system 100 of FIG. 2, according to one embodiment. Method 101 includes receiving data from sensors 175 (110). Method 101 further includes sending a control signal for adjusting a flow rate of a secondary fluid circulating along cooling circuit 130 based on the data obtained by sensor 175 (121). In one embodiment, the flow rate of the secondary fluid is adjusted by sending a control signal from control system 170 to pump 133 disposed along cooling circuit 130.

Figure 12:
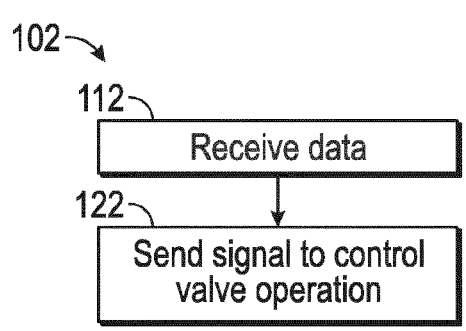

Referring to FIG. 12, method 102 is shown in accordance with power supply system 100 of FIG. 3, according to one embodiment. Method 102 includes receiving data from sensors 175 (112). Method 102 further includes sending a control signal for controlling (i.e., opening or closing) valve 136 to increase the amount of fluid circulating along cooling circuit 130 to thereby increase the amount of heat energy exchanged between data server 140 and the fluid based on the data (122). In one embodiment, operation of valve 136 is controlled by sending a control signal from control system 170 directly to valve 136.

In another embodiment, in accordance with power supply system 100 of FIG. 4, method 102 includes sending a control signal for controlling (e.g., opening or closing) valve 136 to increase the amount of fluid circulating along conduit 120 to thereby increase the amount of heat energy exchanged between data server 140 and the fluid. Operation of valve 136 is controlled by sending a control signal from control system 170 directly to valve 136.

Figure 13:
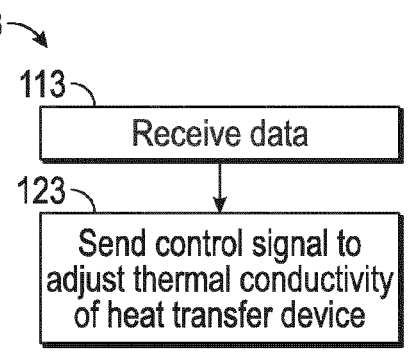

Referring to FIG. 13, method 103 is shown in accordance with power supply system 100 of FIG. 2, according to one embodiment. Method 103 includes receiving data from sensors 175 (113). Method 103 further includes sending a control signal for adjusting a thermal conductivity of heat transfer device 135 (where heat transfer device 135 is a heat pipe) to thereby control an amount of heat energy exchanged between data server 140 and fluid circulating along cooling circuit 130 based on the data (123).

Figure 14:
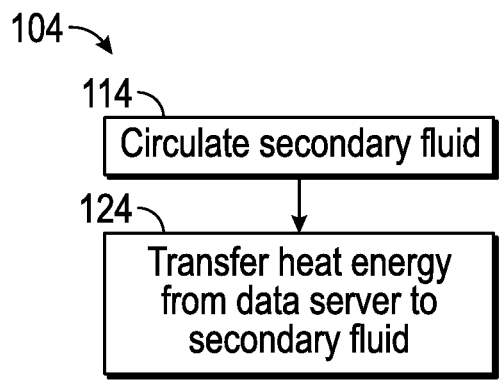

Referring to FIG. 14, method 104 is shown in accordance with power supply system 100 of FIGS. 2 and 4, according to one embodiment. Method 104 includes circulating a secondary fluid (i.e., a second fluid, an intermediate fluid, etc.) along cooling circuit 130 (114). Method 104 further includes absorbing/receiving heat energy from data server 140 into the secondary fluid using conduction (124).

Figure 15:
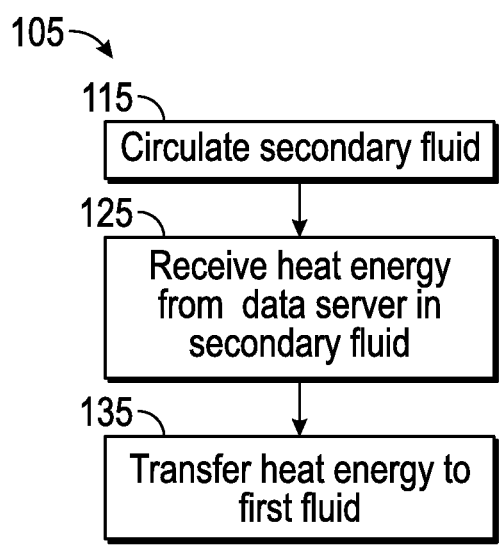

Referring to FIG. 15, method 105 is shown in accordance with power supply system 100 of FIGS. 1 and 4, according to one embodiment. Method 105 includes circulating a secondary fluid (i.e., a second fluid, an intermediate fluid, etc.) along cooling circuit 130 and across data servers 140 (115). Method 105 further includes absorbing/receiving heat energy from data servers 140 into the secondary fluid (125). Heat transfer device 135 exchanges heat energy between the secondary fluid circulating in cooling circuit 130 and the fluid (i.e., a first fluid) flowing along conduit 120 toward electrochemical power generator 110 (135).

The present disclosure contemplates methods, systems, and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures may show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A power supply system for a data center, comprising:
a cooling circuit including a fluid, the cooling circuit configured to receive at least a portion of heat energy generated by a server located in the data center;
an electrochemical power generator configured to receive the fluid of the cooling circuit and to generate electrical energy for the server using the fluid; and
a processor configured to control an amount of heat energy transferred from the server to the fluid based on data relating to the server.

2. The system of claim 1, wherein the data includes a temperature of the server.

3. The system of claim 1, wherein the data includes a power demand of the server.

4. The system of claim 1, wherein the data includes a power delivery rate from the electrochemical power generator.

5. The system of claim 1, wherein the data includes a usage level of the server.

6. The system of claim 1, wherein the data includes a temperature of the fluid after receiving heat energy from the server.

7. The system of claim 1, wherein the data includes a temperature change of the fluid after receiving heat energy from the server.

8. The system of claim 1, wherein the data is indicative of a temperature of the server, and wherein the processor is configured to increase the amount of heat energy transferred to the fluid when the temperature exceeds a threshold value.

9. The system of claim 1, wherein the data is indicative of a temperature of the server, and wherein the processor is configured to decrease the amount of heat energy transferred to the fluid when the temperature is below a threshold value.

10. A power supply system for a data center, comprising:
a cooling circuit configured to exchange heat energy between a server located in the data center and a fluid being circulated in the cooling circuit such that at least a portion of the heat energy released by the server is absorbed by the fluid; and
an electrochemical power generator configured to receive the fluid from the cooling circuit and to generate electrical energy for the server using the fluid.

11. The system of claim 10, wherein the fluid is a reactant for the electrochemical power generator.

12. The system of claim 11, wherein the reactant includes a fuel for the electrochemical power generator.

13. The system of claim 11, wherein the reactant includes an oxidant for the electrochemical power generator.

14. The system of claim 10, wherein the cooling circuit includes a heat transfer device configured to exchange heat energy between the server and the fluid using conduction.

15. The system of claim 10, wherein the cooling circuit includes a heat pipe configured to exchange heat energy between the server and the fluid.

16. The system of claim 10, wherein the fluid in the cooling circuit is received from a storage tank.

17. The system of claim 10, wherein the electrochemical power generator is configured to generate a by-product from an electrochemical reaction.

18. The system of claim 17, further comprising a regeneration system configured to regenerate the by-product into a reactant using electricity received from a power source.

19. The system of claim 10, wherein the electrochemical power generator is a flow battery.

20. The system of claim 10, wherein the electrochemical power generator is a fuel cell.

21. A system for a data center, comprising:
a cooling circuit including a fluid, the cooling circuit configured to receive at least a portion of heat energy generated by a server located in the data center;
an electrochemical power generator configured to receive the fluid of the cooling circuit and to generate power for the server using the fluid; and
a processor configured to:
receive power demand data regarding a power demand of the server;
control an amount of electrical energy generated by the electrochemical power generator based on the power demand data; and
control an amount of heat energy transferred to the fluid from the server based on the power demand data.

22. The system of claim 21, wherein the processor is configured to increase the amount of heat energy transferred to the fluid when the power demand of the server increases.

23. The system of claim 21, wherein the processor is configured to decrease the amount of heat energy transferred to the fluid when the power demand of the server decreases.

24. The system of claim 21, wherein the fluid is a reactant for the electrochemical power generator.

25. The system of claim 21, wherein the fluid is a first fluid, and wherein the cooling circuit includes a heat transfer device having a second fluid separate from the first fluid such that the heat energy is transferred from the server to the first fluid via the second fluid.

26. The system of claim 21, wherein the cooling circuit includes a heat transfer device, and wherein the heat transfer device is configured to receive heat energy from the server using conduction.

27. The system of claim 21, wherein the cooling circuit includes a heat pipe configured to receive heat energy from the server.

28. The system of claim 27, wherein the processor is configured to adjust a thermal conductivity of the heat pipe to control the amount of heat energy transferred from the server to the fluid.

29. The system of claim 21, wherein the cooling circuit includes a heat exchanger configured to receive heat energy from the server.

30. The system of claim 29, wherein the heat exchanger is further configured to deliver heat energy to the fluid.

31. The system of claim 30, wherein the processor is configured to control an area of contact between the fluid and the heat exchanger to control the amount of heat energy transferred from the server to the fluid.

32. The system of claim 30, wherein the heat exchanger includes an intermediate fluid, and wherein the processor is configured to adjust a flow rate of the intermediate fluid to control the amount of heat energy transferred from the server to the fluid.

33. The system of claim 30, further comprising a valve configured to divert a portion of the fluid to or away from the heat exchanger to control the amount of heat energy transferred to the fluid.

34. The system of claim 21, wherein the processor is configured to adjust a flow rate of the fluid to control the amount of heat energy transferred from the server to the fluid.

35. The system of claim 21, wherein the fluid in the cooling circuit is received by a storage tank.

* * * * *